United States Patent

Schadhauser et al.

[11] Patent Number: 5,880,937
[45] Date of Patent: Mar. 9, 1999

[54] ELECTRICAL CIRCUIT ARRANGEMENT HAVING EQUIPOTENTIAL SURFACE FOR REDUCED HIGH-FREQUENCY INTERFERENCE

[75] Inventors: Klaus Schadhauser, Munich, Germany; Stefano Baggio, Treviso, Italy

[73] Assignee: Patent-Treuhand-Gesellschaft fuer elektrische Gluehlampen mbH, Munich, Germany

[21] Appl. No.: 811,794

[22] Filed: Mar. 6, 1997

[30] Foreign Application Priority Data

| Mar. 8, 1996 | [DE] | Germany | 196 08 938.7 |
| Jan. 10, 1997 | [DE] | Germany | 197 00 666.3 |

[51] Int. Cl.[6] .............. H05K 9/00; H05K 1/11; H05K 1/14
[52] U.S. Cl. .......... 361/794; 174/35 R; 174/35 GC; 174/51; 361/753; 361/818
[58] Field of Search ............. 174/35 R, 267, 174/35 GC, 266, 51, 265, 255, 264, 260, 262, 261, 263; 257/659, 660, 723, 724, 691, 728; 307/66, 90, 89, 91; 333/246, 247, 180, 181, 182, 184, 185; 361/760, 777, 780, 783, 775, 816, 818, 212, 220, 782, 753, 794, 799, 800; 439/108, 109, 607, 609

[56] References Cited

U.S. PATENT DOCUMENTS

| 4,649,461 | 3/1987 | Matsuta | 174/35 R |
| 4,764,684 | 8/1988 | Fiorina et al. | 307/66 |
| 4,904,968 | 2/1990 | Theus | 333/247 |
| 4,933,804 | 6/1990 | Bertenshaw et al. | 361/111 |
| 4,994,771 | 2/1991 | Takamine et al. | 333/246 |
| 5,023,753 | 6/1991 | Abe | 361/782 |
| 5,036,301 | 7/1991 | Takao et al. | 333/185 |
| 5,341,115 | 8/1994 | Frei et al. | 333/246 |
| 5,357,060 | 10/1994 | Yamashita | 174/267 |
| 5,398,169 | 3/1995 | Gorenz, Jr. et al. | 361/818 |

FOREIGN PATENT DOCUMENTS

| 0264765B1 | 5/1991 | European Pat. Off. . |
| 4137207A1 | 5/1993 | Germany . |
| 4418886A1 | 12/1995 | Germany . |
| 61180571 | 8/1986 | Japan . |
| 06233521 | 8/1994 | Japan . |

OTHER PUBLICATIONS

Journal : "Schalnetzteile" of Siemens AG, Berlin 1990, pp. 72 et seg Journal : Schalnetzteile in der Praxis O. Kilgenstein, Vogel Bachverylag, 1986, pp.: 355 et seg.

Primary Examiner—Donald Sparks
Attorney, Agent, or Firm—Carlo S. Bessone

[57] ABSTRACT

A circuit arrangement (4) for the operation of electrical lamps, with a printed circuit board (5), on which electrical components (14) and conductor strips (7; 19; 20) are arranged, whereby potential changes that are rapid over time occur on printed circuit board (5), has an equipotential surface (6) for reducing the radio interference caused by these potential changes. For this purpose, equipotential surface (6) with resting potential relative to the rapid potential changes is connected onto printed circuit board (5). In particular, the equipotential surface is produced by a copper layer (6) on the upper side of printed circuit board (5). The advantage is a simple-to-produce arrangement that can be automated for reducing radio interference.

18 Claims, 4 Drawing Sheets

ELECTRICAL CIRCUIT ARRANGEMENT HAVING EQUIPOTENTIAL SURFACE FOR REDUCED HIGH-FREQUENCY INTERFERENCE

FIELD OF THE INVENTION

The invention concerns electrical circuit arrangements for the operation of electrical lamps as well as a process for the production of such circuit arrangements.

This type of electrical circuit arrangement is suitable both for operating discharge lamps, particularly fluorescent lamps and high-pressure lamps, as well as for operating incandescent lamps, e.g., low-volt halogen bulbs. For the operation of discharge lamps, such circuit arrangements are generally called "electronic lamp ballasts" (ELB), whereas for the operation of low-volt halogen bulbs, the designation "electronic transformer" or "electronic converter" is common.

BACKGROUND OF THE INVENTION

The given circuit arrangements produce undesired radio interference, among other things, during operation, if suitable countermeasures are not present. Causes for this are for the most part rapid changes in potential—referred to in the following as HF potential for brevity—on the printed circuit board, e.g., by rapid switching transistors, relative to the grounded housing (devices of safety class I) or relative to the environment or ground (devices of safety class II). Electrical HF fields associated with rapid changes in potential can influence, by capacitive couplings, in-phase interference currents, which flow, for example, on the mains input lines. The current loop is thus essentially closed between the circuit arrangement and ground via parasitic capacities. An in-depth description of the formation of radio interferences is found, for example, in W. Hirschmann and A. Hauenstein: "Switching network components", Siemens AG, Berlin, 1990, pp. 72 ff. With respect to the limiting values for radio interference, particularly in the case of electrical operating devices for lamps, VDE 0875, which corresponds to the international standard CISPR 15, must be upheld.

A common measure for suppressing in-phase interference currents consists of connecting an anti-interference filter, e.g., a current-compensated choke in the mains input lines of the circuit arrangement. The design of current-compensated chokes, is explained, for example, in O. Kilgenstein: "Switching network components in practice", Vogel Buchverlag, Würzburg, 1986, pp. 355 ff. Its effect is based on the fact that the actual current of the mains frequency can pass unattenuated. In-phase interference currents of high frequency, on the other hand, are filtered out by the high inductivity of the current-compensated choke. Of course, limits are placed on a compact construction, since the anti-interfering effect of a current-compensated choke is reduced or even can be reversed into an opposite effect, particularly due to magnetic interference fields, by directly adjacent component parts and their interference signals.

In devices of safety class I, Y capacitors can also be connected from the mains input line toward safety or ground conductors, whereby at least part of the in-phase interference currents can flow out to ground. In apparatuses of safety class II, this is not possible.

EP Patent 0 264 765 describes an electronic converter for the operation of low-volt halogen bulbs, which has a current-compensated choke for radio interference. In addition, the secondary side of the power transformer—this also serves as a decoupling circuit, which transforms the phased voltage of the switching part to the nominal voltage of the connected low-volt halogen bulb—is also connected to the plus or minus pole of the mains rectifier via a capacitor. In this way, an HF short circuit is produced, which minimizes interference voltages by means of the power transformer. Of course, this measure is limited to electronic converters.

In DE 41 37 207 A1, an HF-anti-interference is disclosed, which is also based on an HF short circuit and can be utilized in principle both for ELB's as well as in electronic converters. For this purpose, an HF signal, for example, in the case of an ELB, is decoupled from the serial resonance circuit of the discharge lamp and is connected with an anti-interference choke connected in the mains input line via a high-pass filter. With an optimal dimensioning of the high-pass filter, almost no interference currents flow over the mains input lines. Of course, the HF impedance of the anti-interference choke varies as a function of the value of the input voltage flowing through it. In this way, the anti-interference effect is sensitively modified with the connected load.

SUMMARY OF THE INVENTION

The invention takes on the task of eliminating the named disadvantages and providing a circuit arrangement for operating electrical lamps, which produces only small radio interferences and in principle is suitable both for electronic converters as well as for electronic lamp ballasts. Another part of the task is to provide a particularly economical solution with as few additional structural components as possible. Another part of the task is to provide a process for the production of the circuit arrangement on a printed circuit board.

For a better understanding of the invention, the concept of the electrical equipotential surface will be introduced first. In the following, this concept is understood to mean a surface that is a good electrical conductor, e.g., a foil, film, or plate of metal or of another electrically conducting material, for example, an electrically conducting plastic. The basic concept of the invention consists of arranging one or several equipotential surfaces that are electrically isolated relative to the surroundings in the vicinity of the conductor strips and electronic components with HF potential. If the circuit arrangement is arranged in a circuit housing of electrically conducting material, the housing even serves as an equipotential surface. If not, a separate electrically conducting screen surface serves as the equipotential surface. Over and above this, the equipotential surface(s) is (are) joined with a resting potential relative to the rapid potential changes on the printed circuit board.

In principle, almost every point of the circuit arrangement is suitable for joining with the equipotential surface, as long as it fills the above-named condition—negligible HF potential. Of course, care must be taken that the "short circuited" HF interference current does not flow out in an undesired way over the components of the circuit arrangement and possibly cause interference in this manner. For this reason, an appropriate ground conductor strip is particularly suitable for connecting with the equipotential surface.

The basic point of these measures—simply considered—is to introduce (at least) one additional capacity specifically into the circuit arrangement by means of the equipotential surface(s). The additional capacity functions almost as the lowest possible ohmic "short circuit" for the high-frequency radio interference source. Such an equipotential surface—as in the vicinity of ground, e.g., the grounded base plate of a light in which the circuit arrangement is incorporated—can be interpreted as the counter-half of an additional capacitor corresponding to the conductive strips of the printed circuit board. The capacity of this additional capacitor is preferably greater, particularly much greater than the parasitic stray capacitance of the conductor strips relative to ground. In the latter case, the additional capacity acts almost as a short circuit for rapidly changeable, i.e., high-frequency interference currents. Consequently, the undesired interference currents vs. ground are appropriately reduced and in fact this process is essentially more efficient, the higher the additional capacity relative to the parasitic stray capacitance.

In fact, a circuit arrangement with a metal surface for radio interference has already been disclosed in DE 44 18 886 A1. Of course, this metal surface—in contrast to the present invention—has a potential that is rapidly variable over time. Stated more precisely, this potential is inverted in time relative to the interference signal. The purpose of this measure is a compensation of the interference signals by opposite-phase signals produced by the metal surface. A disadvantage of this solution is the fact that the compensation principle requires as precise as possible a fitting of the concrete geometric configuration of the metal surface in order to avoid an undesired undercompensation or overcompensation.

In contrast to this, in the present invention, the concrete geometric configuration of the equipotential surface(s) is relatively uncritical relative to the functional principle. An expensive and time-consuming fitting to the respective circuit, as in the state of the art, is superfluous. As long as the value of the additional capacity lies at least on the order of magnitude of the parasitic stray capacitance of the circuit arrangement, or, in particular, is higher than this value— which can be accomplished without problem in practice—a good reduction of radio interference will be achieved.

The concrete value of the additional capacity of the invention can be influenced by the geometrical configuration of the equipotential surface(s), particularly by its surface area as well as by the distance to the conductor strips. Within a region that can be practically manipulated, the value increases with increasing surface area and decreasing distance. In the case of two or more equipotential surfaces, the individual additional capacities are additive, corresponding to the parallel circuit of capacitors.

In a first embodiment of the invention, the equipotential surface is arranged on the upper side of the printed circuit board, thus on the side of the printed circuit board on which the components are found. In a particularly preferred embodiment, the entire upper side is covered with a copper layer. Of course, the leads of the components are led out to the under side of the printed circuit board, thus to the side of the printed circuit board, on which the conductor strips— and if necessary SMD (Surface Mounted Device) components soldered directly with the conductor strips—are found. This large-surface copper layer has the advantage that all conductor strips loaded with interference are detected by the additional capacity. In addition, the concrete arrangement of the individual components on the printed circuit board—i.e., the layout of the printed circuit board—has a less critical effect on the production of interference signals.

This embodiment is preferably produced by means of a perforated, double-sided copper-plated printed circuit board. As usual, the conductor strips are formed from the copper layer of the under side of the printed circuit board by means of a known etching process. The copper layer of the upper side is contacted with a ground conductor strip at least on one place by means of a suitable drilled hole in the printed circuit board, for example, by means of a wire bridge. The advantage of this solution is that no additional measures or additional components are required in addition to the already-mentioned electrical connection between the copper layer and the ground conductor strip. The ground conductor strip is purposely selected such that it is found at the resting potential relative to the rapid potential changes (HF potential) during the operation of the circuit arrangement. If necessary, a relatively slow or static potential difference between the ground conductor strip and ground has no effect on the advantageous operation of the invention.

In a second embodiment, the equipotential surface is arranged on the under side of the printed circuit board, on which the conductor strips are found, thus on the solder side. For this purpose, a flat copper layer is introduced onto the printed circuit board between the conductor strips and electrically insulated from these. The flat copper layer may also comprise several partial surfaces that are joined together in an electrically conducting manner. This is connected with a ground conductor strip, for example, by means of a solder bridge. This embodiment is primarily provided for a one-sided copper-plated printed circuit board, i.e., if the upper side of the printed circuit board does not have a copper layer.

In another embodiment, the equipotential surface is formed by an electrically conducting screening surface or surfaces, e.g., copper or aluminum sheet or foil, arranged in the region of the upper side and/or lower side of the printed circuit board. Preferably the screening surface(s) is or are at least as large as the printed circuit board and arranged essentially parallel to the printed circuit board, i.e., on the inside of the housing cover or the bottom of the circuit arrangement. In addition, the screening surface is contacted with a ground conductor strip, e.g., by means of a copper band.

Another example of embodiment proposes an advantageous connection between the equipotential surface, i.e., if needed, the circuit housing itself (case I) or the electrically conducting screening surface (case II), e.g., aluminum foil, on the one side, and the ground conductor strip or in general a resting potential relative to the HF potential on the printed circuit board, on the other side.

According to the invention, the wire bridge is arranged on the printed circuit board such that it is bent over one edge of the printed circuit board and functions there as an electrical contact for the equipotential surface. For this purpose, a first end of the wire bridge is joined with the ground conductor strip or a resting potential on the printed circuit board. The second end of the wire bridge is bent over the edge of the printed circuit board. After inserting the printed circuit board into the circuit housing, in the first case, the housing wall itself presses against the part of the wire bridge projecting over the edge of the printed circuit board. In the second case, the housing wall first presses against the screening surface— which also extends over the indicated edge—and consequently against the part of the wire bridge projecting over the edge of the printed circuit board. In both cases, an electrical connection is produced between the ground conductor strip and the equipotential surface—i.e., the circuit housing in case I or the screening surface in case II—by the depicted arrangement by means of the wire bridge.

The advantage of this solution is that no additional expensive connecting techniques, e.g. soldering or riveting, are required, other than contacting by frictional connection. In addition, the production of the circuit arrangement including printed circuit board and screening as well as its mounting in the housing can be well automated, it is simple and inexpensive.

In a particularly preferred variant, the second end of the wire bridge is also joined with the printed circuit board, e.g., by a soldering or adhesive spot. In this way it is assured that the wire bridge does not shift during mounting and in this way in the most undesirable case does not form a contact with the equipotential surface. This can be produced particularly advantageously by means of a small opening at the edge of the printed circuit board, e.g., by a notch or a semicircularly shaped drilled hole, in which the part of the wire bridge bent around the edge of the printed circuit board is partially embedded. The dimensions of the opening and the wire diameter are thus adapted to one another such that a sufficient part of the wire bridge projects over the opening and can serve as the contact surface.

According to the invention, the printed circuit board with the circuit connection is produced in the following way. As is generally common in mass production, several circuit arrangements are automatically produced on a large useful board. Then the individual printed circuit boards with the circuit arrangements found thereon are separated from this large useful board. For this purpose, the circuit arrangements arranged next to one another on the useful board are individually bounded by means of gap millings. The gap millings serve as break-off places at the end of the manufacture. Within the gap millings, which separate the circuit arrangements arranged next to one another, a drilled hole is introduced for every wire bridge. The first end of the wire bridge is joined with the ground conductor strip of the respective circuit arrangement. The second end of the wire bridge is guided through the drilled hole and is attached to the printed circuit board with a "half" solder point, which leaves open the respective gap milling.

Other arbitrary combinations of the above-named embodiments are conceivable, particularly if increased requirements are placed on freedom from interference. Then in the individual case, the possible reduction of interference signals is to be weighed against the additional work involved and the costs associated therewith.

BRIEF DESCRIPTION OF THE DRAWINGS

The invention will be explained in more detail in the following on the basis of several examples of embodiment.

Here

BEST MODE FOR CARRYING OUT THE INVENTION

Figure 1A:
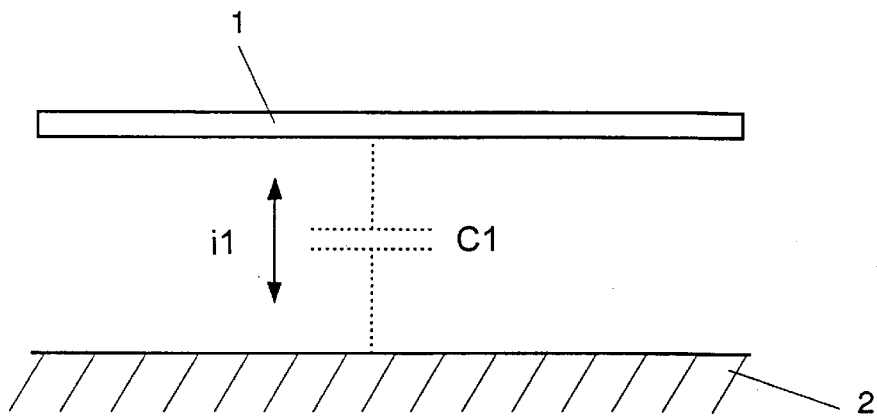
FIG. 1a shows a schematic representation of the capacitive coup ling between a conductor strip with HF potential and ground, without measures for reduction of radio interference.
Figure 1B:
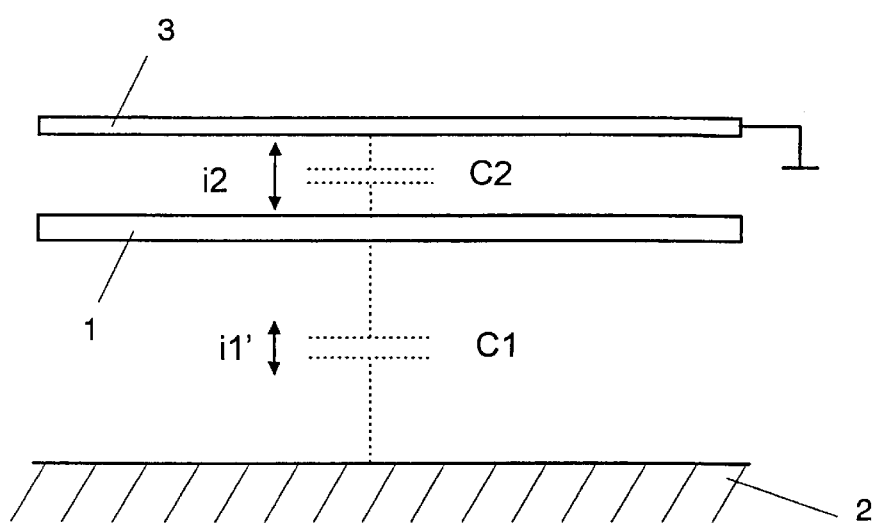
FIG. 1b, like FIG. 1a, but with a copper plate connected with ground potential for reducing radio interference.
Figure 1C:
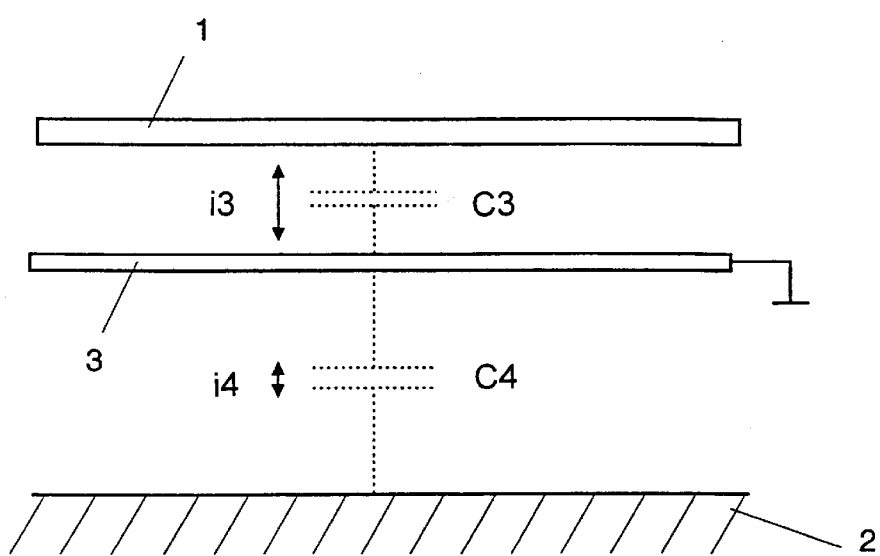
FIG. 1c shows an arrangement of a copper plate connected with ground, modified relative to FIG. 1b.

FIGS. 1a–1c serve in the following for a simplified explanation of the basic principle of the invention. The same features are designated by the same reference numbers. A determination relative to any theoretical explanation is not intended.

In FIG. 1a, first the capacitive coupling between a conductor strip 1 with rapid potential changes, i.e., with HF potential, and ground 2 is shown schematically. Without measures for reducing radio interference, an undesired radio interference current $i_1$ flows over parasitic capacity $C_1$—symbolized by a dotted capacitor between conductor strip 1 and ground 2.

The arrangement of the invention in FIG. 1b also has a copper plate 3 connected with ground potential, which functions as an equipotential surface with a resting potential relative to the HF potential of conductor strip 1. Copper plate 3 is arranged on the side of conductor strip 1 turned away from ground 2 and is arranged essentially parallel to this. Based on a suitable dimensioning and arrangement of copper plate 3, a parasitic capacity $C_2$ results between copper plate 3 and conductor strip 1, which is larger than parasitic capacity $C_1$ between conductor strip 1 and ground 2, i.e., $C_2 > C_1$. Ideally, $C_2 \gg C_1$. Under the assumption that $C_2 \cdot U_2 > C_1 \cdot U_1$—thus $U_1$, $U_2$ designate the HF voltages that are nearly the same in practice and flow over parasitic capacities $C_1$ or $C_2$—most of the radio interference current $i_2$ consequently flows over capacity $C_2$ to copper plate 3 and only a small part $i_1'$ flows over capacity $C_1$ to ground 2, i.e., $i_2 > i_1'$. Ideally, $i_1'$ is vanishingly small, i.e., $i_1' \approx 0$.

FIG. 1c shows another arrangement of the invention in schematic representation. Unlike the arrangement in FIG. 1b, here, copper plate 3 is arranged on the side of conductor strip 1 turned toward ground 2, i.e., between conductor strip 1 and ground 2. In practice, copper plate 3 is purposely connected with a ground conductor strip, whose HF potential difference relative to ground 2 is essentially negligible. In this way the radio interference current flows out nearly completely over copper plate 3. Consequently, the radio interference current $i_4$ flowing over ground 2 is negligibly small, but in each case essentially smaller than the radio interference current $i_3$ flowing out over copper plate 3.

Figure 2:
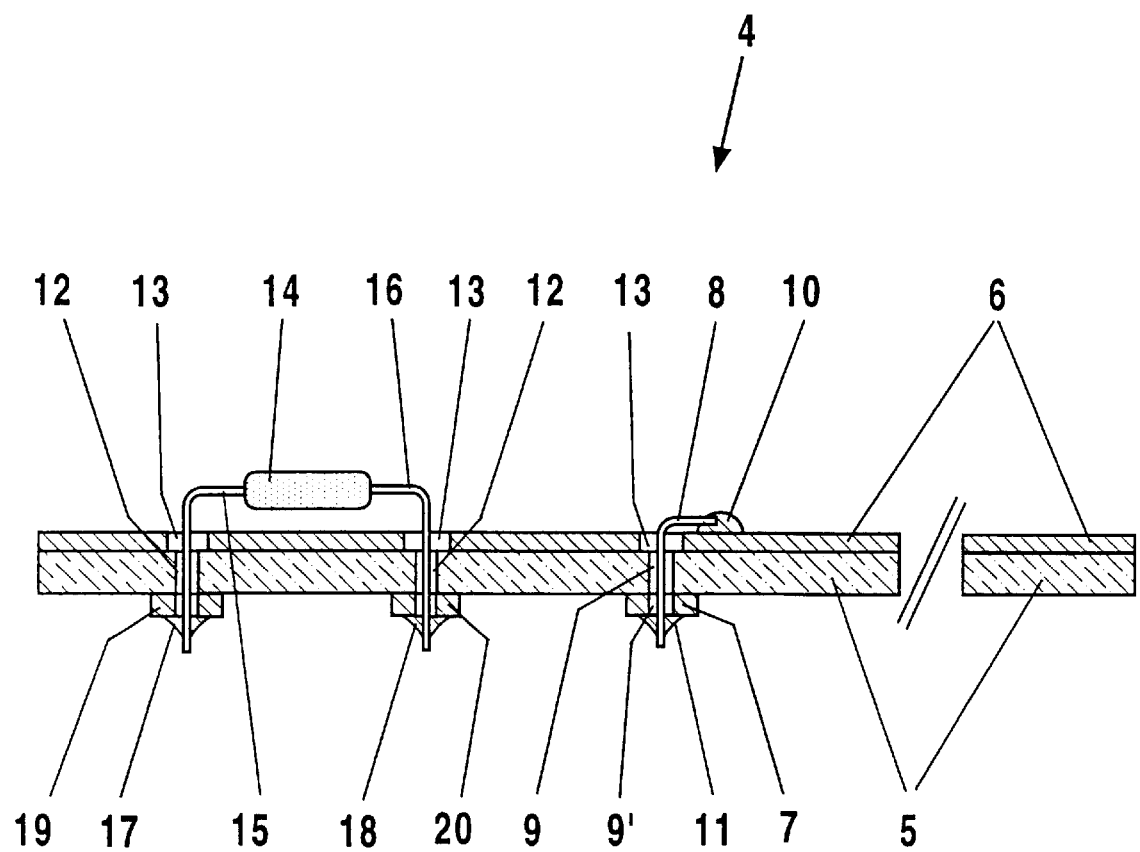
FIG. 2 shows an arrangement of a copper layer connected with ground potential on a printed circuit board.

FIG. 2 shows a longitudinal section of an arrangement 4 according to the invention in schematic representation. A printed circuit board 5 (only a partial region is shown) is covered nearly completely with a copper layer 6 on its upper side. Copper layer 6 is joined with a ground conductor strip 7 with a resting potential relative to rapid potential changes. Thus it functions as an equipotential surface that reduces radio interference. For this purpose, a wire bridge 8 is arranged in corresponding drilled holes 9, 9' of printed circuit board 5 or ground conductor strip 7. The two ends of the wire bridge are joined with the copper layer 6 on one side and ground conductor strip 7 on the other side by means of two solder points 10, 11. Additional drilled holes 12 in printed circuit board 5 serve in the known way for guiding the connections of the electronic components to the under side, i.e., to the solder side of printed circuit board 5. In the region of drilled holes 9, 12, copper layer 6 is provided with circular recesses 13, which prevent undesired contacting between the terminals and copper layer 6. The ratios are represented, for example, on the basis of a two-pole connection 14. Two-pole connection 14 here stands only symbolically for an electronic component with rapid potential changes. The two terminals 15, 16 of two-pole connection 14 are guided through openings 13 and drilled holes 12 to the under side of printed circuit board 5 and are there joined by means of two solder points 17, 18 with conductor strips 19, 20 corresponding to the circuit arrangement.

Figure 3A:
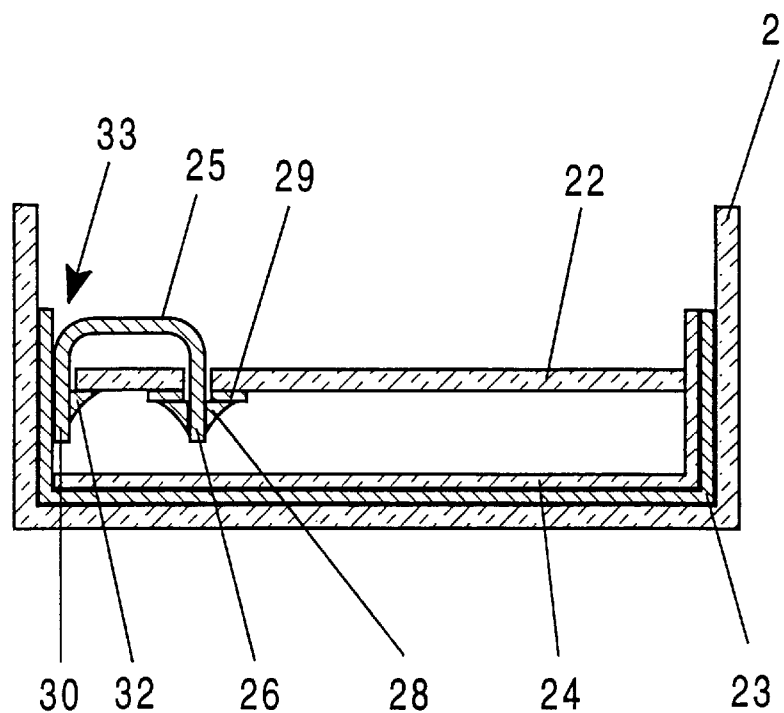
FIG. 3a shows the cutaway representation of a circuit housing including printed circuit board and screening surface, which is contacted with a ground conductor strip by means of a wire bridge.
Figure 3B:
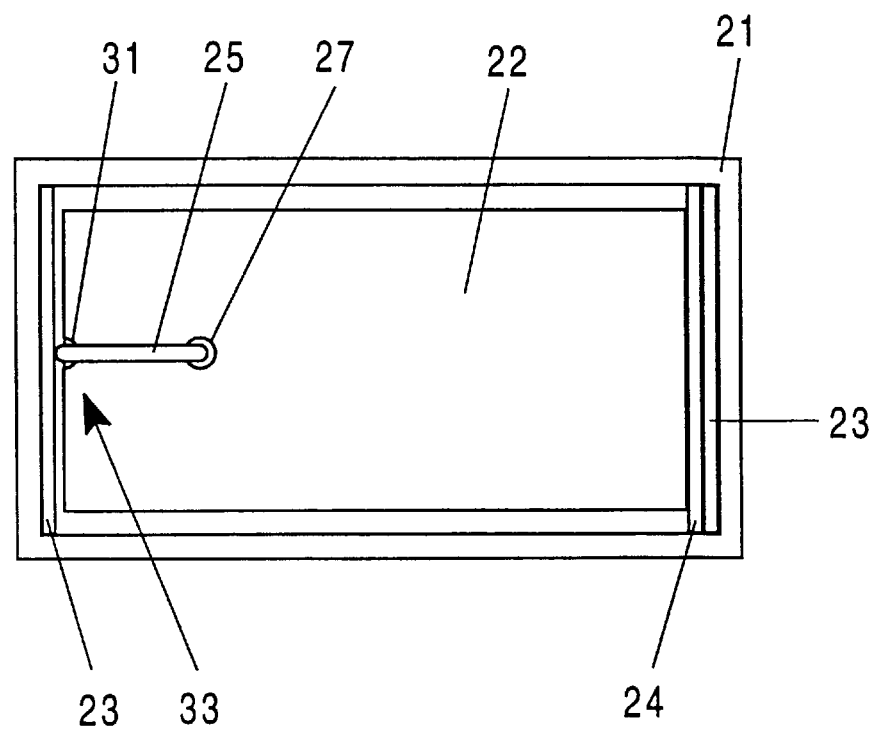
FIG. 3b, as FIG. 3a, but in top view.

An embodiment of the contacting of a screening surface with a ground conductor strip on a printed circuit board 22 within a circuit housing 21 made of electrically nonconducting material is shown schematically in section or in top view in FIGS. 3a and 3b. The screening surface is formed of a metal foil 23 and an insulating foil 24, whereby insulating foil 24 is arranged between electrically conducting metal foil 23 and printed circuit board 22. A first end 26 of a wire bridge 25 is guided through a drilled hole 27 into printed circuit board 22 and is joined by means of solder point 28 with ground conductor strip 29 of the circuit arrangement (not shown). The second end 30 of wire bridge 25 is guided into a semicircular shaped notch 31 at the edge of printed circuit board 22 in such a way that this part of wire bridge 25 projects over the edge of the printed circuit board. By means of the "half" solder point 32, the second end 30 of wire bridge 25 is attached to the under side of printed circuit board 22. In addition, insulating foil 24 extends only in the region of the under side of printed circuit board 22. On the other hand, metal foil 23 extends up over this additionally along the edge of the printed circuit board with notch 31. In this way, insulating foil 24 prevents electrical short circuits between the components or terminals (not shown) on the printed circuit board and metal foil 23. On the other hand, metal foil 23 and wire bridge 25 are electrically contacted in region 33. Consequently, in this way, the screening effect of metal foil 23 is assured. The components of the circuit arrangement arranged on printed circuit board 22 are not shown here for reasons of a simple overview. Also for clarity of representation, due to the dimensions of wire bridge 25 as well as the thickness of metal foil 23 or insulating foil 24, these have been intentionally shown enlarged in relation to printed circuit board 22.

In one variant (not shown) the insulating foil completely covers the side of the metal foil turned toward the printed circuit board. The two foils are bordered at the edge of the printed circuit board on the side of the wire bridge in such a way that the side of the metal foil that is there turned away from the insulating foil points in the direction of the printed circuit board and consequently serves as the contact surface for the wire bridge. With a suitable selection of material for the metal foil and its thickness, e.g., a thin copper sheet is also suitable, the spring effect of the border may also serve for an increased pressure force between the contact surfaces of the metal sheet and the wire bridge and consequently for an improved, more reliable contacting.

Figure 4:
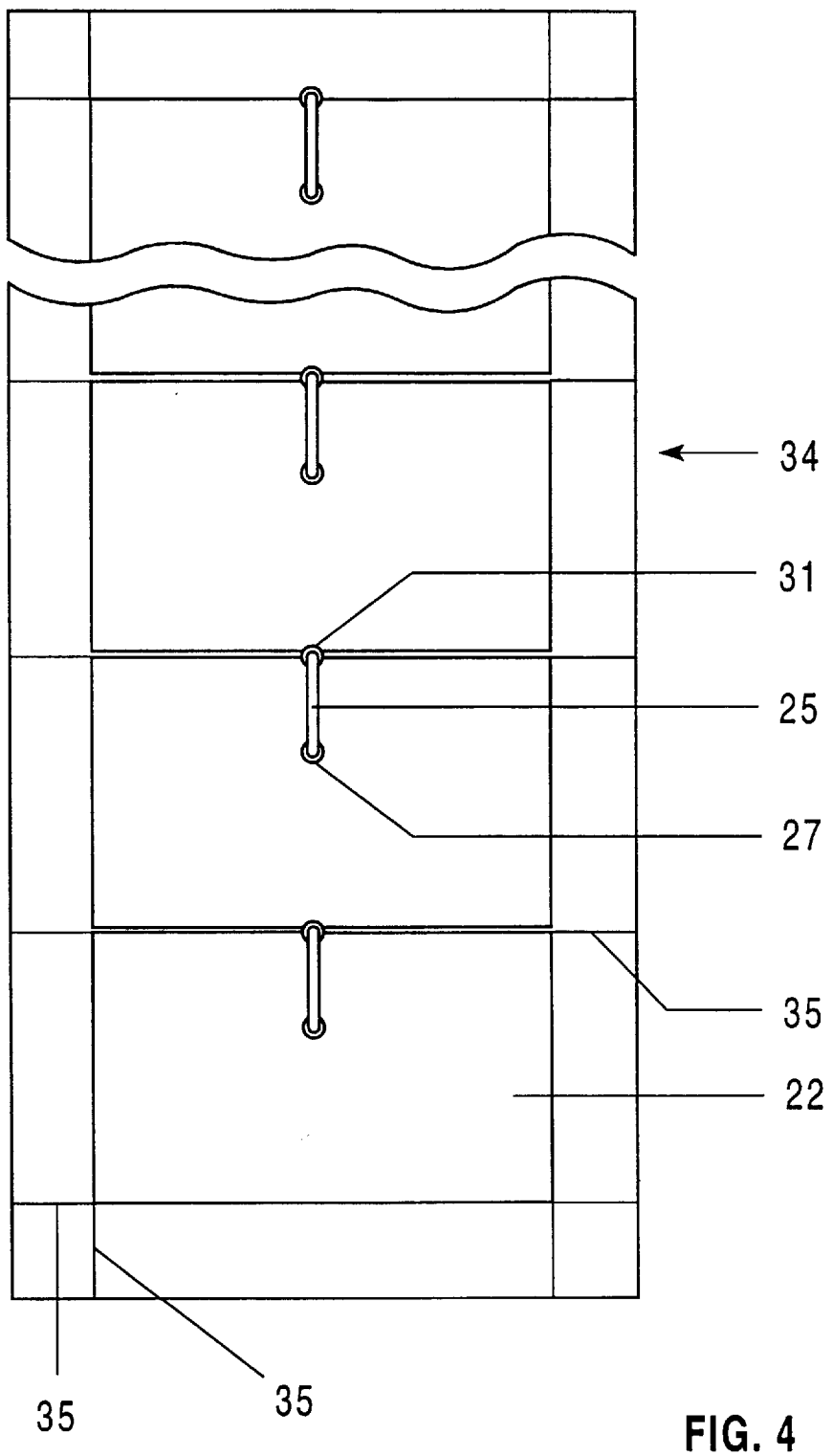
FIG. 4 shows a useful board, from which a multiple number of printed circuit boards with wire bridges can be produced.

FIG. 4 serves for illustrating the process of the invention for producing printed circuit boards of the invention with a wire bridge for contacting with an equipotential surface, e.g., a screen foil, or, if necessary, the metal circuit housing. The same features are designated with the reference numbers corresponding to FIGS. 3a, 3b. A useful board 34 comprised of a multiple number of individual printed circuit boards 22 of the type as shown in FIGS. 3a, 3b has been specifically produced. For this purpose, useful board 34—after the individual circuit arrangements have been introduced onto it next to one another (not shown)—is provided with gap millings 35, which border the individual circuit arrangements. These gap millings 35 later serve as break-off places for breaking apart the individual circuit boards from the useful board 34. A drilled hole 31 for wire bridge 25 is introduced into the same gap milling, which separates every two printed circuit boards that are directly adjacent to one another. In addition, a drilled hole 27 has been provided through ground conductor strip 29 in the printed circuit board layout (not shown here). Then a wire bridge 25 for each printed circuit board 22 is introduced by its first end 26 through the respective drilled hole 27 and soldered with a solder point 28 on the back side of printed circuit board 22 (not shown). The respective second end 30 of wire bridge 25 is guided through the appropriate drilled hole 31 and soldered on the reverse side of printed circuit board 22 with a "half" solder point 32 (not shown here; refer to FIG. 3a). After printed circuit boards 22 have been equipped and soldered, they are broken apart from useful board 34 along gap millings 35. Then wire bridges 25 project somewhat over the edge of printed circuit board 22 in the region of their second end 30 and are simultaneously held in place by the partly circularly shaped openings of the original drilled holes 31.

The invention is not limited to the indicated examples of embodiment. In particular, individual features of different examples of embodiment may also be combined with one another.

What is claimed is:

1. An electrical circuit arrangement (4) with a printed circuit board (5; 22) for the operation of electrical lamps, on which printed circuit board (5), electrical components (14) and conductor strips (7; 19; 20) are arranged, whereby potential changes that are rapid over time occur on printed circuit board (5; 22), as well as with an equipotential surface (6; 23) for reducing the radio interference caused by these potential changes, is hereby characterized in that equipotential surface (6; 23) is connected with a resting potential (7; 29) relative to the rapid potential changes on printed circuit board (5; 22), the equipotential surface (6; 23) is arranged at least in the vicinity of the upper side or lower side of printed circuit board (5; 22), the equipotential surface (6) is joined with a ground conductor strip (7) arranged on the under side of printed circuit board (5) by means of a solder or wire bridge (8) via a hole (9) in printed circuit board (5).

2. The circuit arrangement according to claim 1, further characterized in that equipotential surface (6) at least partially covers the upper side of printed circuit board (5), whereby those regions (13) on the upper side are spared, in which terminals (15, 16) of components (14) are guided through printed circuit board (5) to conductor strips (19; 20) arranged on the under side of the printed circuit board.

3. The circuit arrangement according to claim 1, further characterized in that the equipotential surface is comprised of a layer (6) or plate (3) of electrically good conducting material.

4. The circuit arrangement according to claim 3, further characterized in that the plate occupies roughly the surface of the printed circuit board.

5. The circuit arrangement according to claim 4, further characterized in that the plate is essentially arranged parallel to the printed circuit board.

6. The circuit arrangement according to claim 3, further characterized in that the equipotential surface comprises two or more partial surfaces.

7. The circuit arrangement according to claim 3, further characterized in that the material comprises metal, particularly copper.

8. The circuit arrangement according to claim 3, further characterized in that the material comprises an electrically conducting plastic.

9. The circuit arrangement according to claim 1, further characterized in that the circuit arrangement has a wire bridge (25), whose first end (26) is connected with resting potential (29) and whose second end (30) is bent over one edge of printed circuit board (22); and printed circuit board (22) is arranged inside a circuit housing (21) in such a way that the bent part of second end (30) of wire bridge (25) contacts equipotential surface (6) in a reliable electrically conducting manner.

10. The circuit arrangement according to claim 9, further characterized in that the edge of printed circuit board (22) has an opening (31) and the bent part of second end (30) of wire bridge (25) is partially embedded in this opening (31).

11. The circuit arrangement according to claim 10, further characterized in that opening (31) has the shape of a partial circle.

12. The circuit arrangement according to claim 9, further characterized in that the bent second end (30) of wire bridge (25) is attached onto printed circuit board (22) by means of "half" solder point (32) in the region of opening (31).

13. The circuit arrangement according to claim 9, further characterized in that circuit housing (21) is comprised of electrical nonconducting material and equipotential surface (23) between printed circuit board (22) and the bent part of second end (30) of wire bridge (25), as well as the inner walls of housing (21), whereby the inner walls press the equipotential surface (23) against the bent second end (30) of wire bridge (25), and in this way the electrical contact between equipotential surface (23) and wire bridge (25) is assured.

14. The circuit arrangement according to claim 13, further characterized in that, in addition, an insulating layer (24) is arranged between equipotential surface (23) and printed circuit board (22).

15. The circuit arrangement according to claim 14, further characterized in that the insulating layer extends over the entire equipotential surface and that insulating layer and equipotential surface are bordered in the region of the bent part of the second end of the wire bridge such that the side of the equipotential surface turned away from the insulating surface contacts the bent part of the second end of the wire bridge in an electrically conducting manner, due to this border.

16. The circuit arrangement according to claim 13, further characterized in that the equipotential surface is comprised of a metal foil (23).

17. The circuit arrangement according to claim 1, further characterized in that the circuit housing comprises electrically conducting material, which circuit housing itself comprises the equipotential surface.

18. The circuit arrangement according to claim 1, further characterized in that a ground conductor strip (29) of the circuit arrangement is used as the resting potential relative to the rapid potential changes.

\* \* \* \* \*